United States Patent
Lo et al.

(10) Patent No.: US 12,419,046 B2
(45) Date of Patent: Sep. 16, 2025

(54) MEMORY DEVICE

(71) Applicant: TAIWAN SEMICONDUCTOR MANUFACTURING COMPANY, LTD., Hsinchu (TW)

(72) Inventors: Wen-Shun Lo, Hsinchu County (TW); Tai-Yi Wu, Hsinchu County (TW); Yingkit Felix Tsui, Cupertino, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 372 days.

(21) Appl. No.: 17/965,020

(22) Filed: Oct. 13, 2022

(65) Prior Publication Data
US 2023/0033098 A1    Feb. 2, 2023

Related U.S. Application Data

(62) Division of application No. 17/331,936, filed on May 27, 2021, now Pat. No. 11,610,907.

(51) Int. Cl.
| | |
|---|---|
| H10B 41/35 | (2023.01) |
| H01L 21/266 | (2006.01) |
| H10B 41/41 | (2023.01) |
| H10B 41/42 | (2023.01) |
| H10D 1/00 | (2025.01) |
| H10D 1/66 | (2025.01) |
| H10D 30/01 | (2025.01) |
| H10D 30/68 | (2025.01) |

(52) U.S. Cl.
CPC ........... *H10B 41/35* (2023.02); *H01L 21/266* (2013.01); *H10B 41/41* (2023.02); *H10B 41/42* (2023.02); *H10D 1/047* (2025.01); *H10D 1/66* (2025.01); *H10D 30/0411* (2025.01); *H10D 30/681* (2025.01)

(58) Field of Classification Search
None
See application file for complete search history.

(56) References Cited

U.S. PATENT DOCUMENTS

| | | | |
|---|---|---|---|
| 6,326,663 B1 * | 12/2001 | Li | H10B 69/00 257/318 |
| 6,329,681 B1 | 12/2001 | Nakamura et al. | |
| 6,528,422 B1 | 3/2003 | Huang et al. | |
| 7,332,407 B2 | 2/2008 | Wang et al. | |
| 2003/0057465 A1 | 3/2003 | Chu et al. | |
| 2004/0192000 A1 | 9/2004 | Ohgishi | |

(Continued)

*Primary Examiner* — Xiaoming Liu
(74) *Attorney, Agent, or Firm* — Birch, Stewart, Kolasch & Birch, LLP

(57) ABSTRACT

A memory device includes a substrate, a first transistor, a second transistor, and a capacitor. The first transistor is over the substrate and includes a select gate. The second transistor is over the substrate and connected to the first transistor in series, in which the second transistor includes a floating gate. The capacitor is over the substrate and connected to the second transistor, wherein the capacitor includes a top electrode, a bottom electrode in the substrate, and an insulating layer between the top electrode and the bottom electrode. The insulating layer includes nitrogen. A nitrogen concentration of the insulating layer increases in a direction from the top electrode to the bottom electrode.

20 Claims, 12 Drawing Sheets

(56) References Cited

U.S. PATENT DOCUMENTS

| | | | |
|---|---|---|---|
| 2011/0024814 A1* | 2/2011 | Oka | H01L 27/0207 |
| | | | 257/E27.084 |
| 2014/0084387 A1* | 3/2014 | Dewey | H01L 21/28264 |
| | | | 257/E21.409 |
| 2015/0221663 A1* | 8/2015 | Tan | H01L 29/7885 |
| | | | 257/300 |
| 2020/0312860 A1* | 10/2020 | Shibaguchi | H01L 29/66568 |

* cited by examiner

MEMORY DEVICE

PRIORITY CLAIM AND CROSS-REFERENCE

This application is a divisional application of U.S. patent application Ser. No. 17/331,936, filed May 27, 2021, which is herein incorporated by reference in its entirety.

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased as a result of decreasing minimum feature size or geometry sizes (i.e., the smallest component (or line) that can be created using a fabrication process). Such scaling down has also increased the complexity of IC processing and manufacturing.

Non-volatile memory device has become a popular storage unit due to various advantages. Particularly, the data saved in the non-volatile memory device is not lost when the power is turned off. When the integrated circuit including non-volatile memory device is scaled down through various technology nodes, the design of the memory device has a consideration of the process integration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
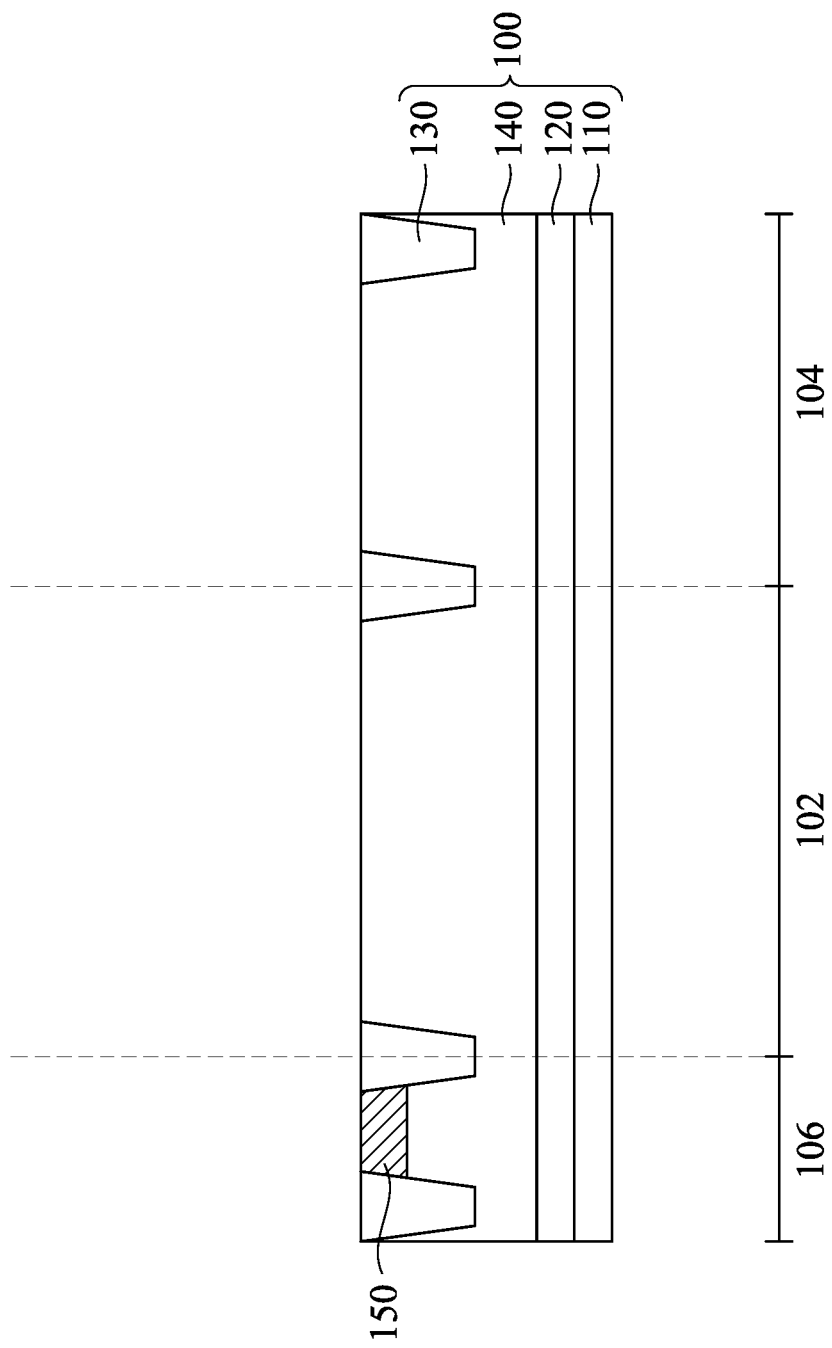
FIG. 1 to FIG. 9 are cross-sectional views of a memory device at various stages of manufacture in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximated, meaning that the term "around", "about", "approximately", or "substantially" can be inferred if not expressly stated.

Some embodiments of this disclosure relate to memory device fabrications and more specifically to non-volatile memory device formations by forming a memory device having a thin insulating layer in a capacitor of the memory device. Because the insulating layer directly below an electrode of the capacitor is thinner than a gate dielectric layer directly below a floating gate of the memory device, a high gate coupling ratio and small layout area of the memory device can be achieved.

FIG. 1 to FIG. 9 are cross-sectional views of a memory device 10 at various stages of manufacture in accordance with some embodiments of the present disclosure. FIG. 1 illustrates a wafer having a substrate 100 thereon. The substrate 100 has a first memory region 102, a second memory region 104, and a peripheral region 106. In some embodiments, the first memory region 102, the second memory region 104, and the peripheral region 106 are adjacent to each other. In some other embodiments, the first memory region 102 and the second memory region 104 are adjacent to each other, and the peripheral region 106 is spaced apart from the first memory region 102 and the second memory region 104. A plurality of memory devices (e.g., single floating gate non-volatile memory devices) may be formed in or over the first memory region 102 and the second memory region 104 and a plurality of periphery circuits may be formed in or over the peripheral region 106. In some embodiments, the first memory region 102 is referred as a transistor region, and the second memory region 104 is referred as a capacitor region. In some embodiments, the substrate 100 includes silicon. In some other embodiments, the substrate 100 includes another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 100 includes a buried layer 110 and a doped region 120 over the buried layer 110. The buried layer 110 may include buried dielectric materials, such as buried oxide (BOX). The buried layer 110 may be formed by a method referred to as separation by implantation of oxygen (SIMOX) technology, wafer bonding, SEG, or other appropriate method. In some embodiments, the buried layer 110 is formed by doping the substrate 100 with dopants having first conductivity type (e.g., N-type in this case) such as phosphorous (P), arsenic (As), antimony (Sb), combinations thereof, or the like. In some embodiments, the doped region 120 may be formed by doping the substrate 100 with dopants having second conductivity type (e.g., P-type in this case) such as boron (B), $BF_2$, $BF_3$, combinations thereof, or the like.

The substrate 100 also includes isolation structures 130 formed over the doped region 120. The isolation structures 130 are formed to surround the first memory region 102, the second memory region 104, and the peripheral region 106 for proper electrical isolation. In some embodiments, the isolation structures 130 are shallow trench isolation (STI). The formation of the isolation structures 130 may include etching trenches in the substrate 100 (e.g., a portion of the substrate 100 over the doped region 120) and filling the trenches by insulator materials such as silicon oxide, silicon nitride, or silicon oxynitride. Each of the filled trenches may have a multi-layer structure such as a thermal oxide liner layer with silicon nitride filling the trenches. In some embodiments, the isolation structures 130 may be created using a process sequence such as: growing a pad oxide, forming a low pressure chemical vapor deposition (LPCVD) nitride layer, patterning STI openings using photoresist and masking, etching trenches in the substrate 100, optionally growing a thermal oxide trench liner to improve the trench interface, filling the trenches with CVD oxide, and using chemical mechanical planarization (CMP) to remove the excessive dielectric layers.

A well region 140 is then formed over the doped region 120. The well region 140 may be formed by doping an upper portion of the substrate 100 with dopants having second conductivity type (e.g., P-type in this case) such as boron (B), $BF_2$, $BF_3$, combinations thereof, or the like. For example, an ion implantation process is performed on the upper portion of the substrate 100 to form the well region 140, followed by an annealing process to activate the implanted dopants of the well region 140. Thereafter, a doped region 150 is formed in the well region 140. The doped region 150 is formed between the isolation structures 130 and in the peripheral region 106 of the substrate 100. In some embodiments, the doped region 150 is doped with dopants having the same conductivity type as the dopants of the well region 140. For example, the dopants of the doped region 150 and the dopants of the well region 140 are P-type dopants. In some embodiments, a dopant concentration of the doped region 150 is higher than a dopant concentration of the well region 140.

Figure 2:
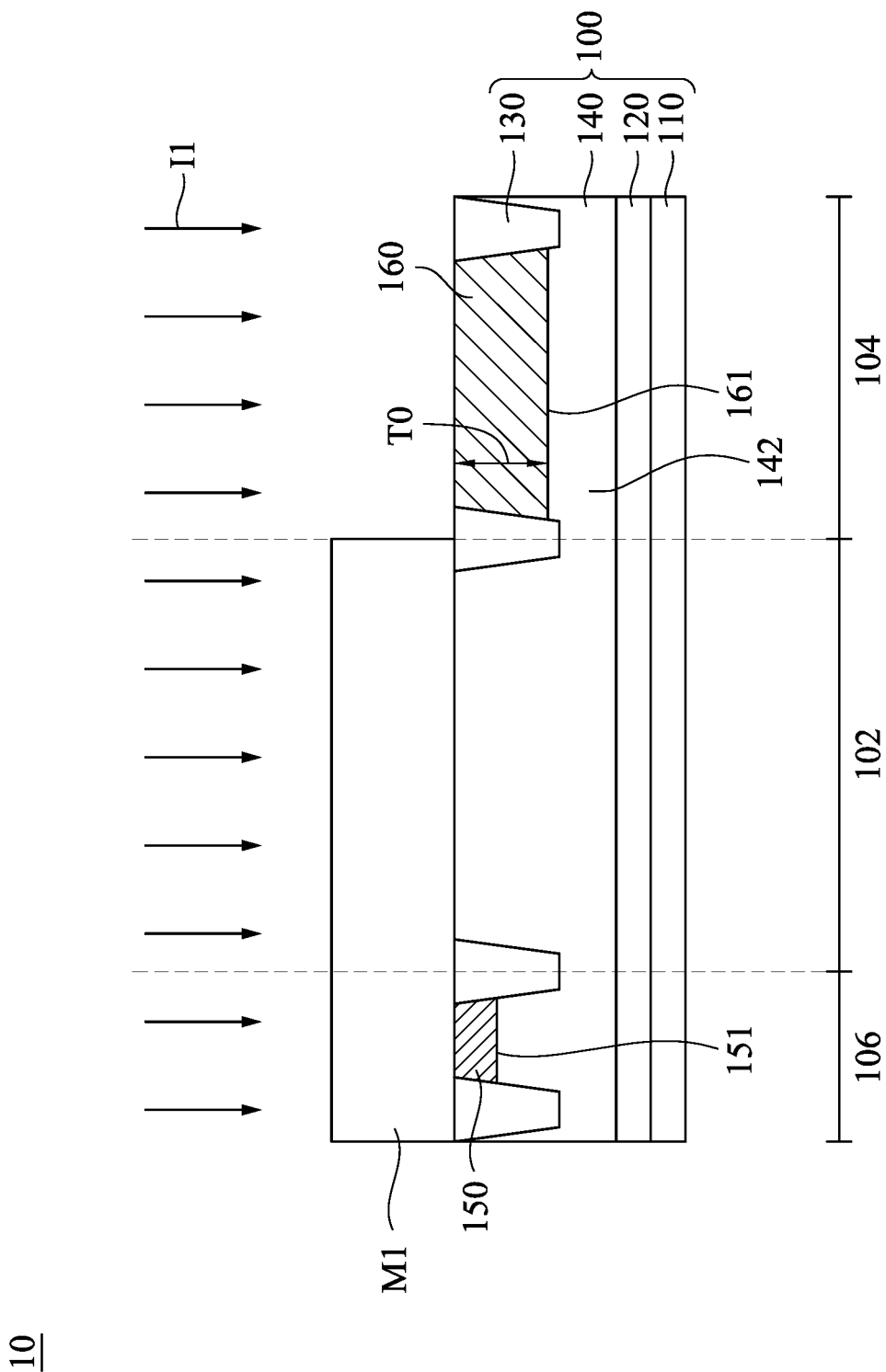

Reference is then made to FIG. 2. An ion implantation process I1 is performed to dope the well region 140 such that a memory cap 160 is formed between the isolation structures 130 and in the second memory region 104 of the substrate 100. In greater details, a portion of the well region 140 in the second memory region 104 is doped to form the memory cap 160 such that the other portions 142 of the well region 140 is direct below to the memory cap 160. In some embodiments, the memory cap 160 is formed by performing the ion implantation process I1 onto the well region 140 with dopants having first conductivity type (e.g., N-type in this case) such as phosphorous (P), arsenic (As), antimony (Sb), combinations thereof, or the like. Subsequently, an annealing process may be performed to activate the implanted dopants of the memory cap 160. In some embodiments, a patterned mask (e.g., patterned photoresist) M1 is formed by using suitable photolithography processes to cover the exposed surfaces of the well region 140 in the first memory region 102 of the substrate 100 and the doped region 150 in the peripheral region 106 of the substrate 100 before performing the ion implantation process I1, and the implantation process I1 is performed using the patterned mask M1 as an implantation mask. In this scenario, the well region 140 in the first memory region 102 of the substrate 100 and the doped region 150 in the peripheral region 106 of the substrate 100 are substantially free of the dopants of the ion implantation process I1 as shown in FIG. 2. In some embodiments, the memory cap 160 is doped with the dopants having different conductivity type from the dopants of the well region 140. For example, the dopants of the memory cap 160 are N-type dopants, and the dopants of the well region 140 are P-type dopants. In some embodiments, a bottom surface 161 of the memory cap 160 is at a different level than a bottom surface 131 of each of the isolation structures 130. For example, the bottom surface 161 of the memory cap 160 is higher than the bottom surface 131 of each of the isolation structures 130. In some embodiments, the bottom surface 161 of the memory cap 160 is at a different level than a bottom surface 151 of the doped region 150. For example, the bottom surface 161 of the memory cap 160 is lower than the bottom surface 151 of the doped region 150. In some embodiments, the memory cap 160 has a (N-type) dopant concentration in a range of about 1E17 atoms/cm$^3$ to about 1E19 atoms/cm$^3$. In some embodiments, a thickness TO of the memory cap 160 is in a range of about 200 nm to about 600 nm.

Figure 3:
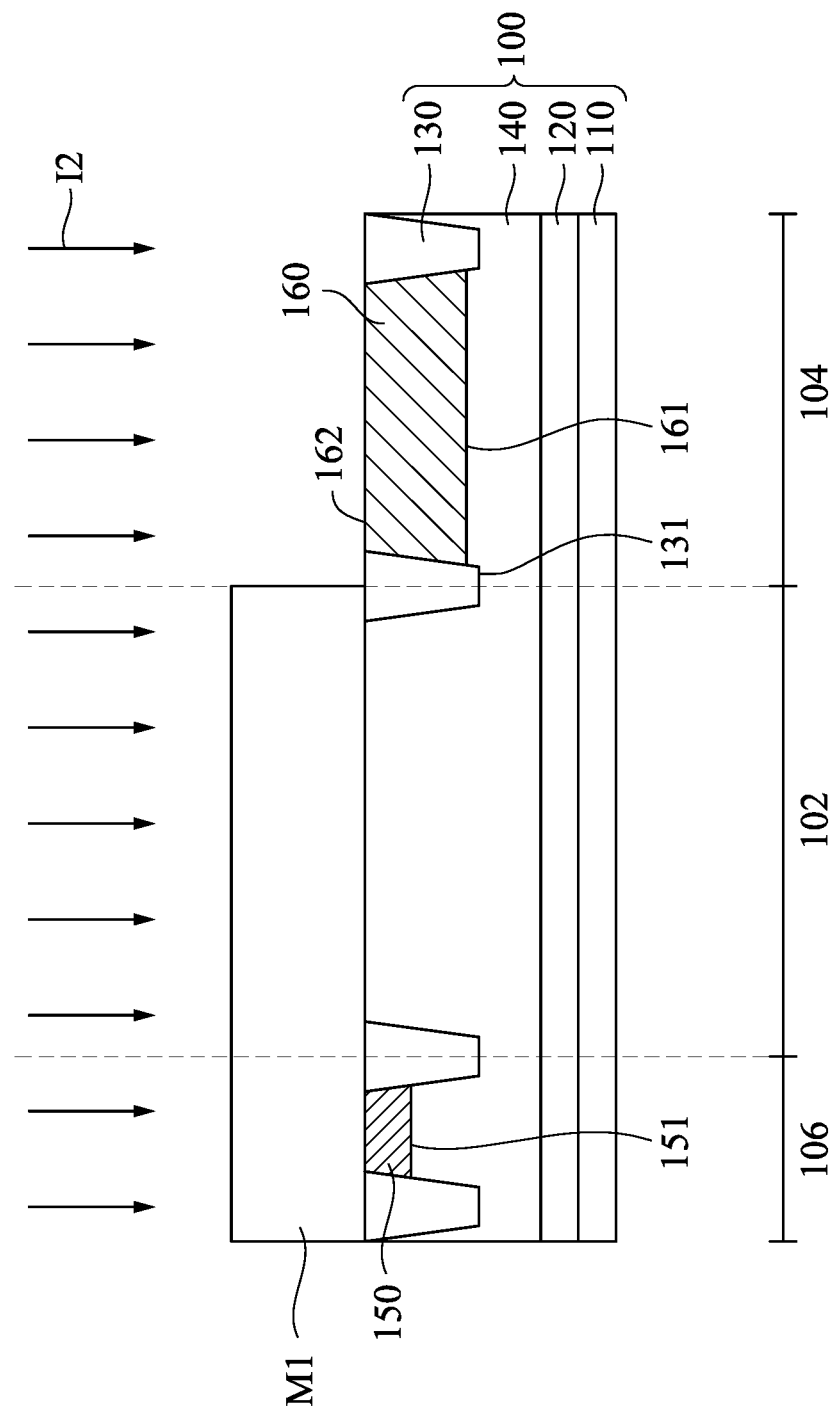

Reference is then made to FIG. 3. An ion implantation process I2 is performed to dope the memory cap 160. The ion implantation process I2 is performed to aid or retard the formation of dielectric materials (e.g., an insulating layer 192 in FIG. 4). For example, the ion implantation process I2 is performed to retard an oxide growth over the memory cap 160. In some embodiments, the memory cap 160 is implanted with dopants such as nitrogen, or other suitable materials. In some embodiments, the ion implantation process I2 is performed at an energy of about 8 keV to about 20 keV and at a dose (or a dopant concentration) of about 1E14 ions/cm$^2$ to about 1E15 ions/cm$^2$. Dopant concentration and/or dopant depth of the resultant memory cap 160 depend on the process conditions of the ion implantation process I2. If the process conditions of the ion implantation process I2 are out of the above selected ranges, the dopant concentration and/or dopant depth in the resultant memory cap 160 may be unsatisfactory for retarding the formation of the dielectric materials in subsequent processes. In some embodiments, the memory cap 160 is referred as an electrode (e.g., a bottom electrode) of a capacitor.

In some embodiments, the implantation process I2 is performed using the patterned mask M1 as an implantation mask, and the patterned mask M1 is then removed (e.g., by ashing) after the ion implantation process I2 is completed. In this scenario, the well region 140 in the first memory region 102 of the substrate 100 and the doped region 150 in the peripheral region 106 of the substrate 100 are substantially free of the dopants of the ion implantation process I2 as shown in FIG. 3. In some embodiments, a nitrogen concentration of the memory cap 160 decreases as the depth of the memory cap 160 increases. The nitrogen concentration of the memory cap 160 decreases in a depth direction of the memory cap 160. That is, the nitrogen concentration of the memory cap 160 at the top surface 162 thereof is higher than the nitrogen concentration of the memory cap 160 at the bottom surface 161 thereof.

Figure 4:
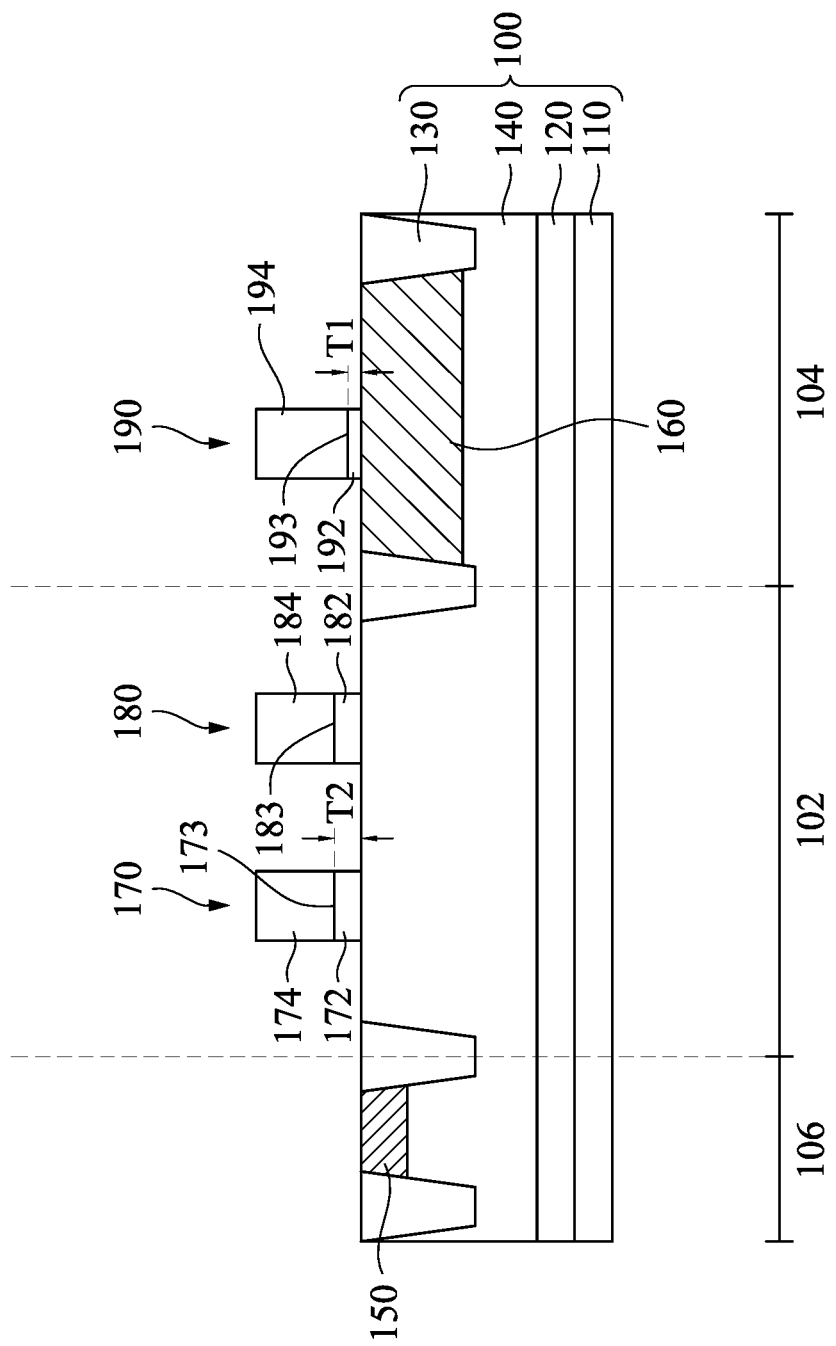

Reference is then made to FIG. 4. A first gate structure 170 and a second gate structure 180 are formed over the first memory region 102 of the substrate 100 and a conductive structure 190 is formed over the second memory region 104 of the substrate 100. In some embodiments, the first gate structure 170, the second gate structure 180, and the conductive structure 190 are simultaneously formed in a same processing procedure. The first gate structure 170 includes a first gate dielectric layer 172 and a select gate 174 stacked on the first gate dielectric layer 172. Similarly, the second gate structure 180 includes a second gate dielectric layer 182 and a floating gate 184 stacked on the second gate dielectric layer 182, and the conductive structure 190 includes an insulating layer 192 and a top electrode 194 (of a capacitor) stacked on the insulating layer 192.

In some embodiments, various material layers, including a dielectric layer and a conductive layer are formed over the substrate 100 by various deposition techniques. Then a lithography patterning process is applied to the various material layers to pattern thereof, forming the first gate structure 170, the second gate structure 180, and conductive structure 190 including respective dielectric features (the first gate dielectric layer 172, the second gate dielectric layer 182, and the insulating layer 192) and electrodes (the select gate 174, the floating gate 184, and the top electrode 194). An exemplary lithography patterning process may include photoresist patterning, etching, and photoresist stripping. The photoresist patterning may further include processing steps of photoresist coating, soft baking, mask aligning, exposing pattern, post-exposure baking, developing photoresist, and hard baking. Lithography patterning may also be implemented or replaced by other proper methods such as maskless photolithography, electron-beam writing, ion-beam writing, and molecular imprint.

In some embodiments, the dielectric layer is formed by performing an oxidation process, such as wet or dry thermal oxidation in an ambient including an oxide, $H_2O$, NO, combinations thereof, or the like. In some other embodiments, the dielectric layer is formed by performing an in-situ steam generation (ISSG) process in an ambient environment of oxide, $H_2O$, NO, combinations thereof, or the like. In still some other embodiments, the dielectric layer is formed by performing a chemical vapor deposition (CVD) process using tetra-ethyl-ortho-silicate (TEOS) and oxygen as a precursor. Alternatively, the dielectric layer is formed by performing an atomic layer deposition (ALD) process, an atomic vapor deposition (AVD), or the like.

Since the memory cap 160 having the dopants (e.g., nitrogen-containing dopants), can retard the formation of dielectric materials, thinner insulating layer 192 can be achieved. After the formation of dielectric layer, the nitrogen (e.g., nitrogen-containing dopants) implanted into the memory cap 160 will diffuse into the insulating layer 192 such that the memory cap 160 is substantially free of nitrogen. In greater details, during the formation of the dielectric layer, a portion of the dielectric materials (e.g., silicon) combines with nitrogen such that activity of the nitrogen-containing dielectric materials (e.g., silicon nitride) would be reduced, thereby difficult to react with oxygen. That is, the formation of dielectric layer directly over the memory cap 160 may be retarded. As such, the insulating layer 192 is thinner than the first gate dielectric layer 172. Similarly, the insulating layer 192 is thinner than the second gate dielectric layer 182. The second gate dielectric layer 182 may have a thickness substantially the same as that of the first gate dielectric layer 172. Since the thickness of the insulating layer 192 is reduced, a capacitance of the capacitor Ca can be increased and gate coupling ratio can be increased, thereby improving performance of the memory device. In some embodiments, a thickness T1 of the insulating layer 192 of the capacitor Ca is in a range of about 80 angstroms (Å) to about 100 angstroms, and a thickness T2 of the second gate dielectric layer 182 (or the first gate dielectric layer 172) of the second gate structure 180 (or the first gate structure 170) is in a range of about 115 angstroms to about 135 angstroms. If the thickness T1 of the insulating layer 192 is out of the above selected ranges, gate coupling ratio would be reduced, thereby adversely affecting performance of the memory device. In some embodiments, a ratio of the thickness T1 of the insulating layer 192 to the thickness T2 of the second gate dielectric layer 182 (or the first gate dielectric layer 172) is from about 0.59 to about 0.87. In some embodiments, the insulating layer 192 has a nitrogen concentration gradient. Specifically, a nitrogen concentration of the insulating layer 192 increases in a direction from the top electrode 194 to the memory cap (i.e., bottom electrode) 160. That is, the nitrogen concentration of the insulating layer 192 at an interface between the insulating layer 192 and the memory cap 160 is higher than the nitrogen concentration of the insulating layer 192 at an interface between the insulating layer 192 and the top electrode 194. In some embodiments, a nitrogen concentration of the insulating layer 192 of the capacitor is higher than a nitrogen concentration of the first gate dielectric layer 172 of the first gate structure 170. Similarly, the nitrogen concentration of the insulating layer 192 of the capacitor is higher than a nitrogen concentration of the second gate dielectric layer 182 of the second gate structure 180. For example, the first gate dielectric layer 172 of the first gate structure 170 and the second gate dielectric layer 182 of the second gate structure 180 are substantially free of nitrogen and thus the nitrogen concentrations of the first gate dielectric layer 172 of the first gate structure 170 and the second gate dielectric layer 182 are substantially zero.

In some embodiments, a top surface 193 of the insulating layer 192 is at a different level than a top surface 173 of the first gate dielectric layer 172 due to the configuration of the memory cap 160 directly below the insulating layer 192. Specifically, the top surface 193 of the insulating layer 192 is lower than the top surface 173 of the first gate dielectric layer 172. Similarly, the top surface 193 of the insulating layer 192 is lower than a top surface 183 of the second gate dielectric layer 182.

In some embodiments, the first gate dielectric layer 172, the second gate dielectric layer 182, and the insulating layer 192 include the same dielectric materials, such as oxide (e.g., silicon oxide) or other suitable dielectric materials. In some embodiments, the first gate dielectric layer 172, the second gate dielectric layer 182, and the insulating layer 192 include high-k dielectric materials. The high-k dielectric materials may have the dielectric constant higher than that of thermal silicon oxide, about 3.9. In one example, the high-k dielectric materials include hafnium oxide (HfO). In various examples, the high-k dielectric materials include metal oxide (such as $HfSiO_2$, ZnO, $ZrO_2$, $Ta_2O_5$, $Al_2O_3$, or the like), metal nitride, or combinations thereof. In some embodiments, the select gate 174, the floating gate 184, and the top electrode 194 include the same conductive materials, such as doped polysilicon or other suitable conductive materials. In some other embodiments, the select gate 174, the floating gate 184, and the top electrode 194 include metal, such as copper, aluminum or other suitable metal. In some embodiments, the conductive structures (e.g. the first gate structure 170, the second gate structure 180, and the conductive structure 190) may further include a conductive layer interposed between the gate dielectric features and the gate electrodes. For example, the conductive layer includes titanium nitride (TiN).

In some embodiments, the first gate structure 170 is configured for a first transistor, such as a field-effect transistor (FET). For example, the first transistor includes a metal-oxide-semiconductor FET (MOSFET), such as n-type MOSFET or p-type MOSFET. In some embodiments, the second gate structure 180 is configured for a second transistor.

Figure 5:
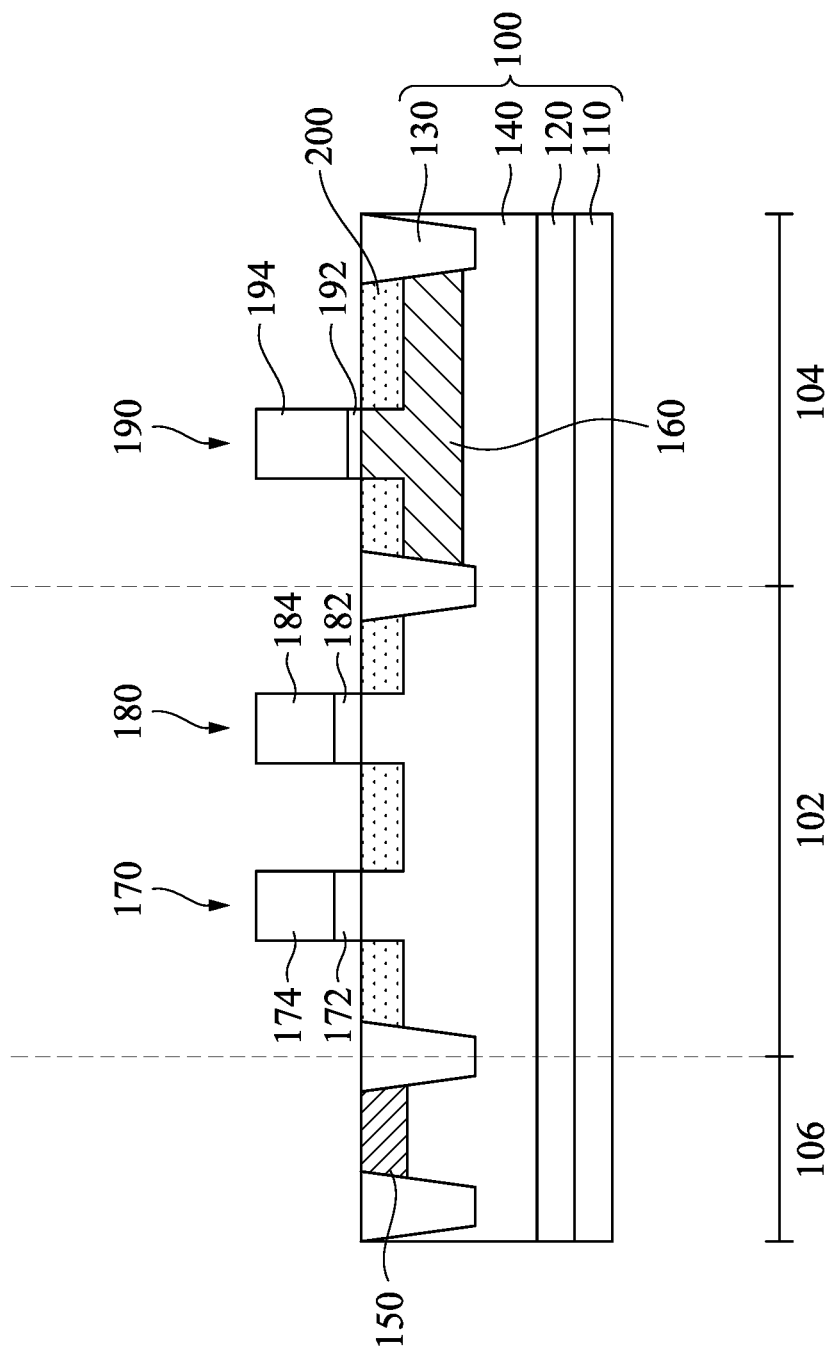

Reference is then made to FIG. 5. Light doped regions 200 are formed between the isolation structures 130. The light doped regions 200 may be referred as light doped source/drain (LDD) features and configured to define doped regions (e.g., source/drain regions) in subsequent processes. In greater details, the light doped regions 200 are formed by an ion implantation process using the first gate structure 170, the second gate structure 180, and the conductive structure 190 as an implantation mask. In this scenario, portions of the well region 140 directly below the first gate structure 170, the second gate structure 180, and the conductive structure 190 are substantially free of dopants of the ion implantation process. The light doped regions 200 are substantially aligned with edges of the first gate structure 170, the second gate structure 180, and the conductive structure 190. In some embodiments, the light doped regions 200 are the first conductivity type (e.g., N-type in this case).

Figure 6:
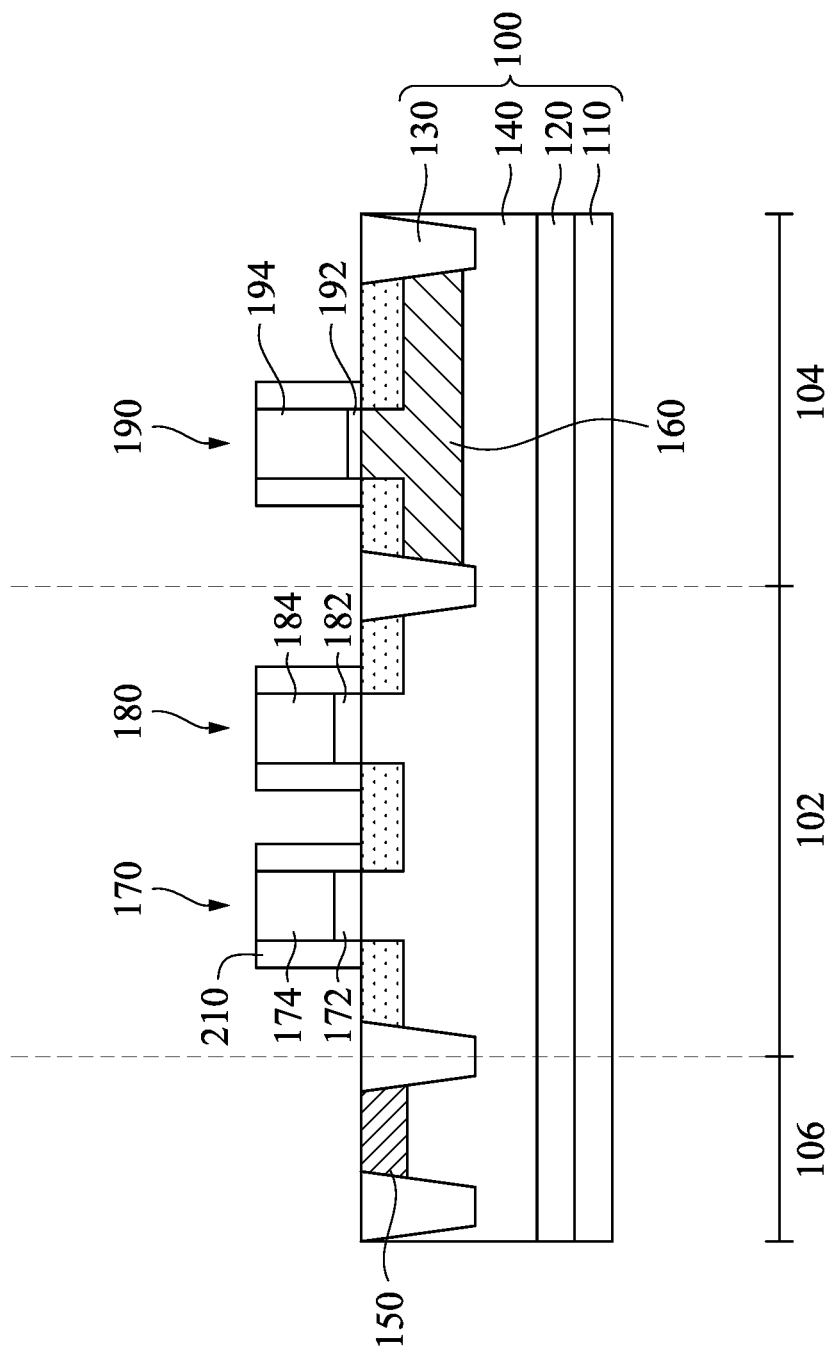

Reference is then made to FIG. 6. Spacer structures 210 are then formed at least on opposite sidewalls of the first gate structure 170, the second gate structure 180, and the conductive structure 190. The spacer structures 210 include one or more dielectric materials, such as silicon oxide, silicon nitride, silicon oxynitride, SiCN, SiCxOyNz, or combinations thereof. The spacer structures 210 may be formed using a deposition method, such as plasma enhanced chemical vapor deposition (PECVD), low-pressure chemical vapor deposition (LPCVD), sub-atmospheric chemical vapor deposition (SACVD), or the like. The formation of the spacer structures 210 may include blanket forming spacer layers and then performing etching operations to remove the horizontal portions of the spacer layers. The remaining vertical portions of the spacer layers form the spacer structures 210.

Figure 7:
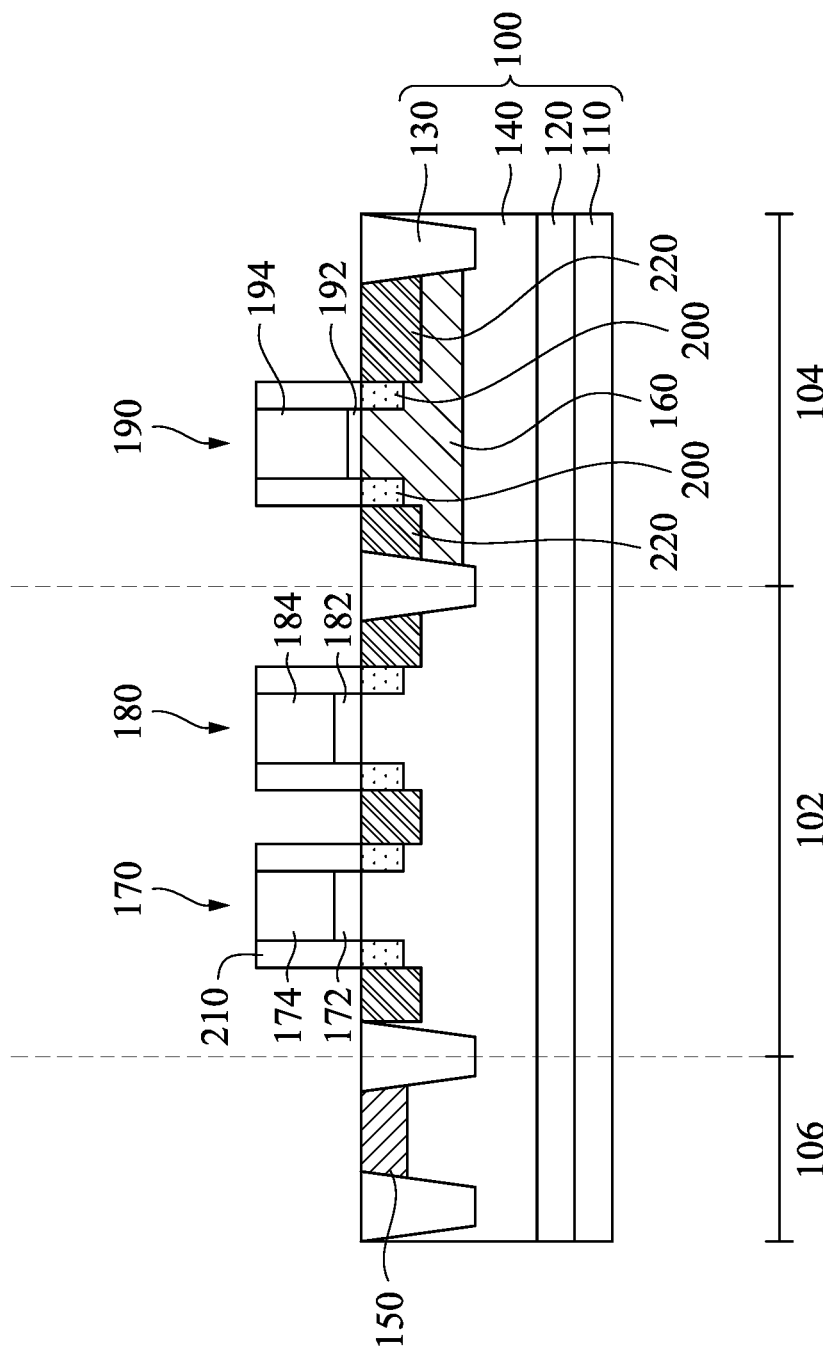

Reference is then made to FIG. 6 and FIG. 7. An ion implantation process is performed to dope the light doped regions 200 such that doped regions 220 are formed in the first memory region 102 and the second memory region 104. The doped regions 220 are formed by the ion implantation process using the spacer structures 210 and the conductive structures (i.e., the first gate structure 170, the second gate structure 180, and the conductive structure 190) as an implantation mask. Further, the doped regions 220 are formed by the ion implantation process with dopants having first conductivity type (e.g., N-type in this case) such as phosphorous (P), arsenic (As), antimony (Sb), combinations thereof, or the like. Then, an annealing process may be performed to activate the implanted dopants of the doped regions 220. In this scenario, portions of the light doped regions 200 are heavily doped to form the doped regions 220, and the other portions of the light doped regions 200 are substantially free of the dopants of the ion implantation process. In some embodiments, the doped regions 220 are doped with the dopants having different conductivity type from the dopants of the well region 140. For example, the dopants of the doped regions 220 are N-type dopants, and the dopants of the well region 140 are P-type dopants. In some embodiments, the doped regions 220 (e.g., doped regions 224 in the bottom electrode 160 in FIG. 9) are formed after forming the top electrode 194.

In some embodiments, the light doped regions 200 are respectively substantially aligned with the spacer structures 210. The doped regions 220 in the first memory region 102 are disposed on both sides of the first gate structure 170. Similarly, the doped regions 220 in the first memory region 102 are disposed on both sides of the second gate structure 180. Each of the doped regions 220 in the second memory region 104 is between the isolation structures 130 and the light doped regions 200. In some embodiments, the doped regions 220 and the light doped regions 200 are doped with the dopants having the same conductivity type, such as N-type dopants. In some embodiments, a dopant concentration of the doped regions 220 is higher than a dopant concentration of the light doped regions 200. In some embodiments, a bottom surface of each of the doped regions 220 is at a different level from a bottom surface of each of the light doped regions 200. For example, the bottom surface of each of the doped regions 220 is lower than the bottom surface of each of the light doped regions 200.

Figure 8:
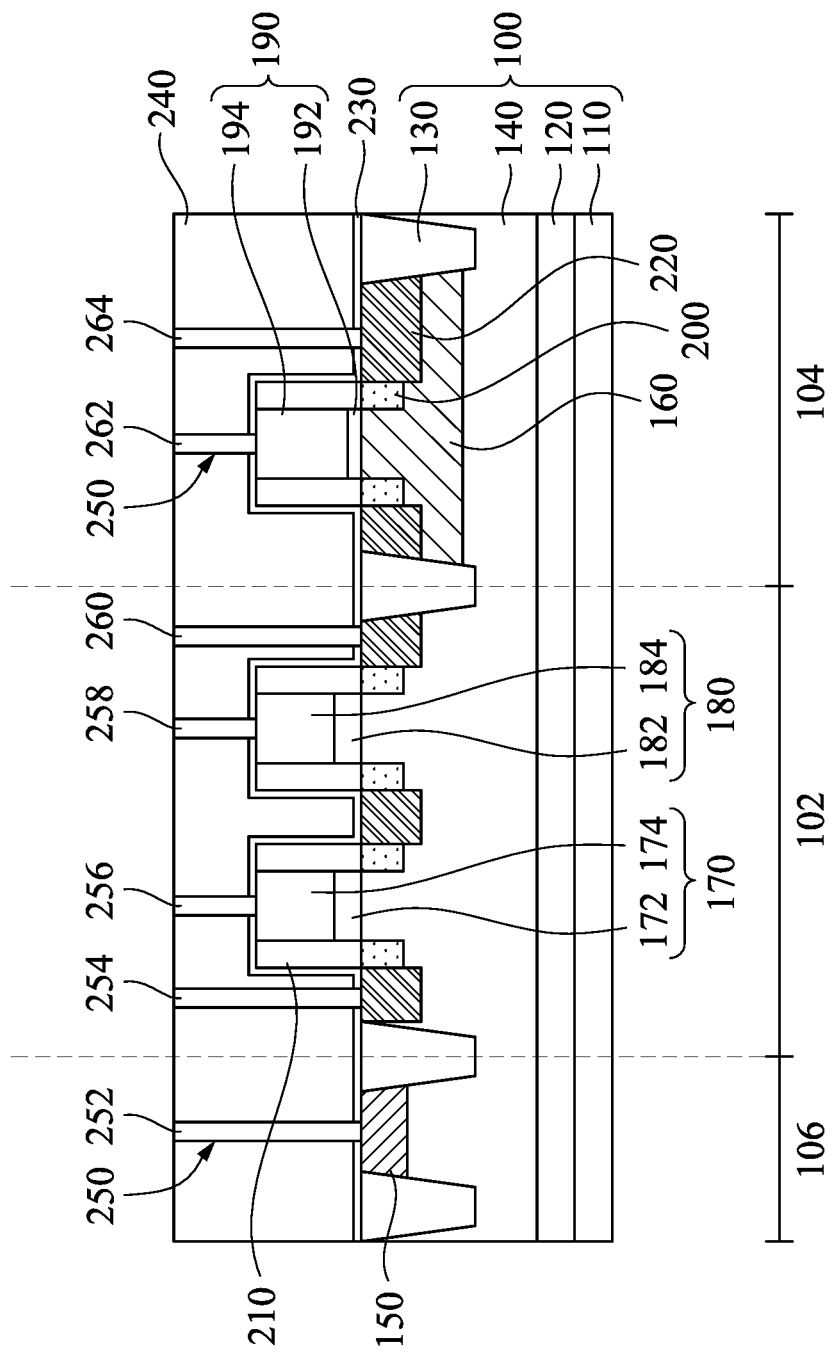

Reference is then made to FIG. 8. An etch stop layer 230 is formed over the structure of FIG. 7. In greater details, the etch stop layer 230 is formed over the substrate 100, the first gate structure 170, the second gate structure 180, and the conductive structure 190. The etch stop layer 230 includes a dielectric material chosen to have etch selectively for proper etching process at subsequent stages. The etch stop layer 230 may be conformal to the surface profile of the substrate 100 such that the etch stop layer 230 substantially covers various features (e.g., the isolation structures 130, the doped region 150, and doped regions 220) on the substrate 100. In some embodiments, the etch stop layer 230 can be a high-κ dielectric layer having a dielectric constant (κ) higher than the dielectric constant of $SiO_2$, i.e. $κ>3.9$. The etch stop layer 230 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), or other suitable materials. The etch stop layer 230 can be formed using plasma enhanced CVD (PECVD), however, other suitable methods, such as low pressure CVD (LPCVD), atomic layer deposition (ALD), and the like, can also be used.

An interlayer dielectric (ILD) layer 240 is then formed over the etch stop layer 230. The ILD layer 240 may be formed over the substrate 100 to a level above top surfaces of the first gate structure 170, the second gate structure 180, and the conductive structure 190 such that the first gate structure 170, the second gate structure 180, and the conductive structure 190 are embedded in. The ILD layer 240 may be formed by chemical vapor deposition (CVD), high-density plasma CVD, spin-on, sputtering, or other suitable methods. In some embodiments, the ILD layer 240 includes silicon oxide, phosphosilicate glass (PSG), borophosphosilicate glass (BPSG), fluorinated silicate glass (FSG), or other suitable materials. In some other embodiments, the ILD layer 240 may include silicon oxy-nitride, silicon nitride, compounds including Si, O, C and/or H (e.g., silicon oxide, SiCOH and SiOC), a low-k dielectric material (dielectric material with dielectric constant less than about 3.9, the dielectric constant of the thermal silicon oxide), or organic materials (e.g., polymers).

In some embodiments, a planarization process is performed to remove portions of the ILD layer 240 such that a top surface of the ILD layer 240 is planarized. The planarization process may be a chemical mechanical planarization (CMP) process. The processing conditions and parameters of the planarization process, including slurry chemical and polishing pressure, may be tuned to partially remove and planarize the ILD layer 240.

After the ILD layer 240 is formed, a plurality of contact holes 250 in the ILD layer 240 are formed aligned with various contact regions including the doped region 150 in the peripheral region 106 and the doped regions 220 in the first memory region 102 and the second memory region 104 such that those contact regions are exposed. In some embodiments, the contact holes 250 are formed and aligned with the conductive structures (i.e., the first gate structure 170, the second gate structure 180 and the conductive structure 190). The contact holes 250 are formed by a lithography process and an etching process including one or more etching steps. The etching process is performed to etch the ILD layer 240 and the etch stop layer 230 to expose the contact regions. In some embodiments, the etching process includes an etching step using a plasma etch with a suitable etchant, such as fluorine-containing etchant, to selectively etch the ILD layer 240 and the etch stop layer 230 without damaging to the doped region 150 in the peripheral region 106.

Conductive materials are then filled in the contact holes 250 to form conductive contacts 252, 254, 256, 258, 260, and 262. In some embodiments, conductive contacts 252, 254, 256, 258, 260, and 262 may include tungsten, copper, aluminum, other suitable metals, or other suitable conductive materials. The conductive contacts 252, 254, 256, 258, 260, and 262 may be formed by using physical vapor deposition (PVD), plating, or combinations thereof. Another CMP process may be applied to remove excessive conductive materials formed outside the ILD layer 240 and to further planarize the top surface of the memory device 10.

The conductive contact 254 on the doped region 220 adjacent to the first gate structure 170 may be connected to a source line (SL) formed in the interconnect structure 270 (FIG. 9), the conductive contact 260 on the doped region 220 adjacent to the second gate structure 180 may be connected to a bit line (BL) formed in the interconnect structure 270, and the conductive contact 264 on the doped region 220 adjacent to the conductive structure 190 may be connected to a word line (WL) formed in the interconnect structure 270. Further, the conductive contact 252 picks up the well region 140. Hence, the peripheral region 106 can be referred to as a body pickup region, and the conductive contact 252 can be referred to as a pick-up contact for picking up the well region 140.

Figure 9:
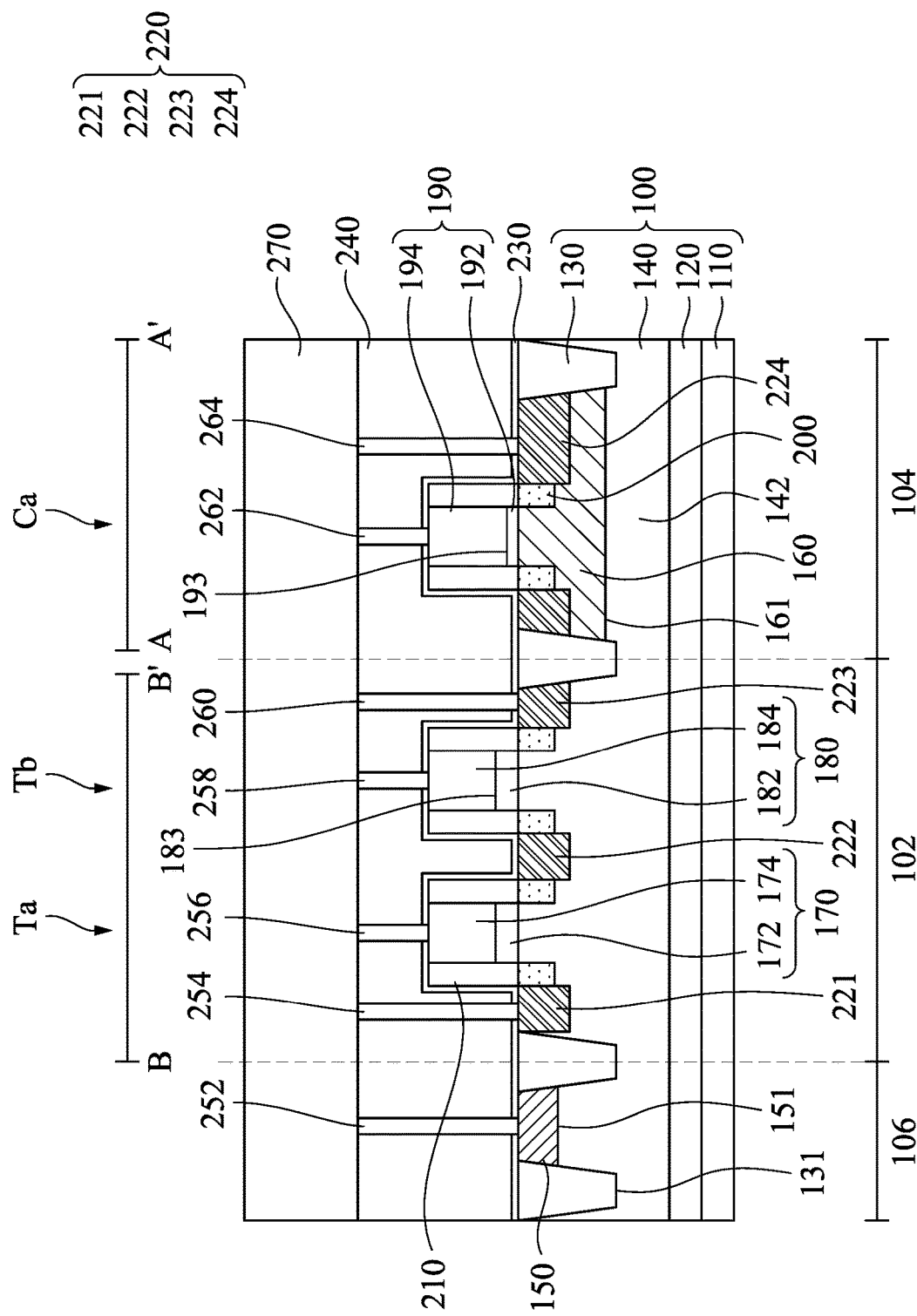

Reference is made to FIG. 9. An interconnect structure 270 is formed over the ILD layer 240. The interconnect structure 270 may include vertical interconnects, such as conductive vias or contacts, and horizontal interconnects, such as metal lines. The various interconnection features may implement various conductive materials including copper, tungsten and silicide. In some embodiments, a damascene process is used to form copper related multilayer interconnection structure. The interconnect structure 270 may be configured to electrically connect the floating gate 184 and the top electrode 194 and further configured to interconnect the floating gate 184 and the top electrode 194 are electrically floating (not operable and accessible to voltage bias). The word line in the interconnect structure 270 is connected to the doped region 224 through the conductive contact 264. The source line in the interconnect structure 270 is connected to the source/drain region 221 through the conductive contact 254. The bit line in the interconnect structure 270 is connected to the source/drain region 223 through the conductive contact 260. It is noted that the doped regions 220 includes source/drain regions 221-223 in the first memory region 102 and a doped region in the second memory region 224.

Figure 10:
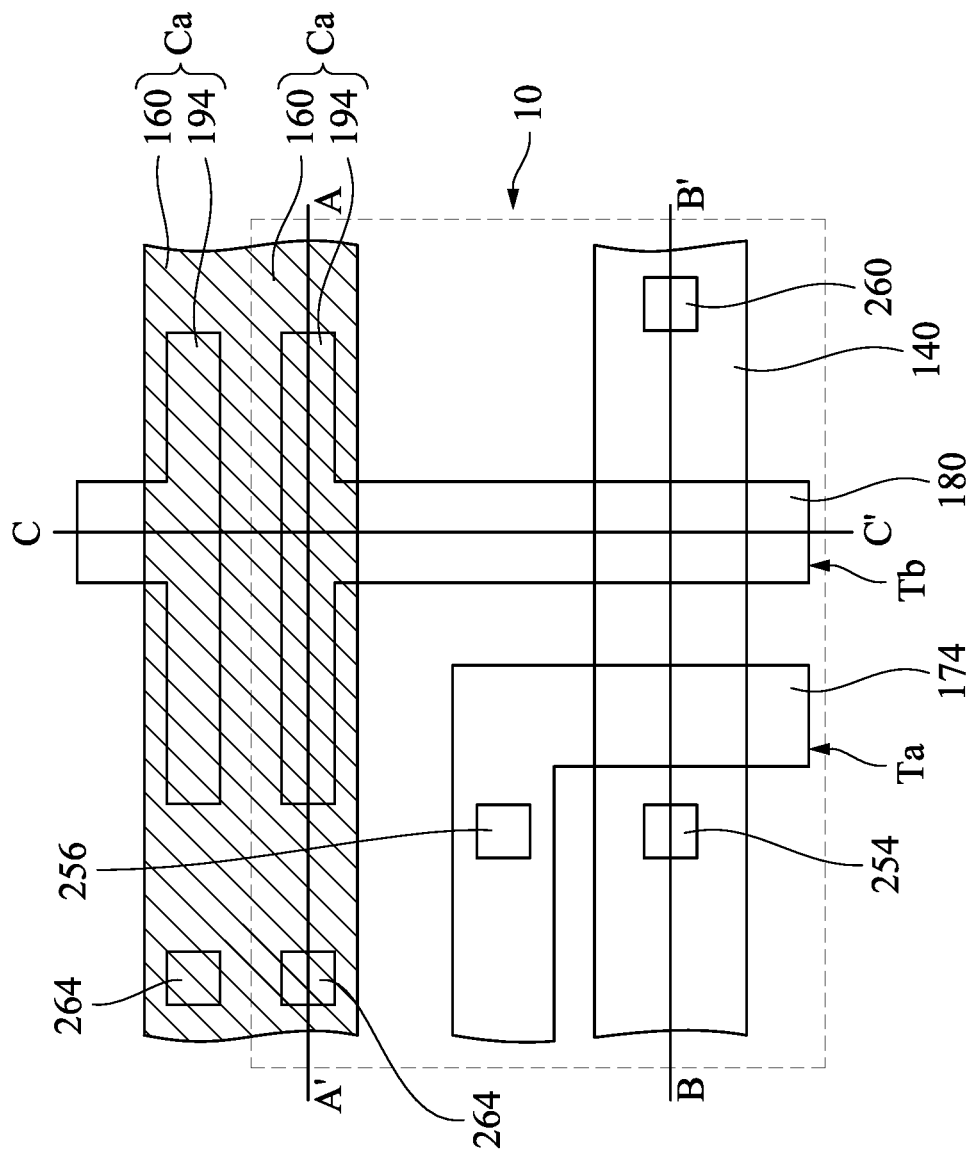
FIG. 10 is a top view of the memory device in FIG. 9.

FIG. 10 is a top view of the memory device 10 in FIG. 9. As shown in FIG. 9 and FIG. 10, the structure over the second memory region 104 of FIG. 9 is taking along line A-A' of FIG. 10, and the structure over the first memory region 102 of FIG. 9 is taking along line B-B' of FIG. 10. For clarity, the doped regions 220 and the light doped regions 200 in the memory cap 160 are not shown in FIG. 10. The memory device 10 includes the substrate 100, a first transistor Ta, a second transistor Tb, and a capacitor Ca. As such, the memory device 10 has a 2T1C (two-transistor-one-capacitor) configuration. The first transistor Ta and the second transistor Tb are disposed over the well region 140 of the substrate 100, and are connected in series. The first transistor Ta includes a select gate 174, and the second transistor Tb includes a floating gate 184. The second transistor Tb is further connected to the capacitor Ca. For example, the top electrode 194 of the capacitor Ca is connected to the floating gate 184 of the second transistor Tb.

Figure 11:
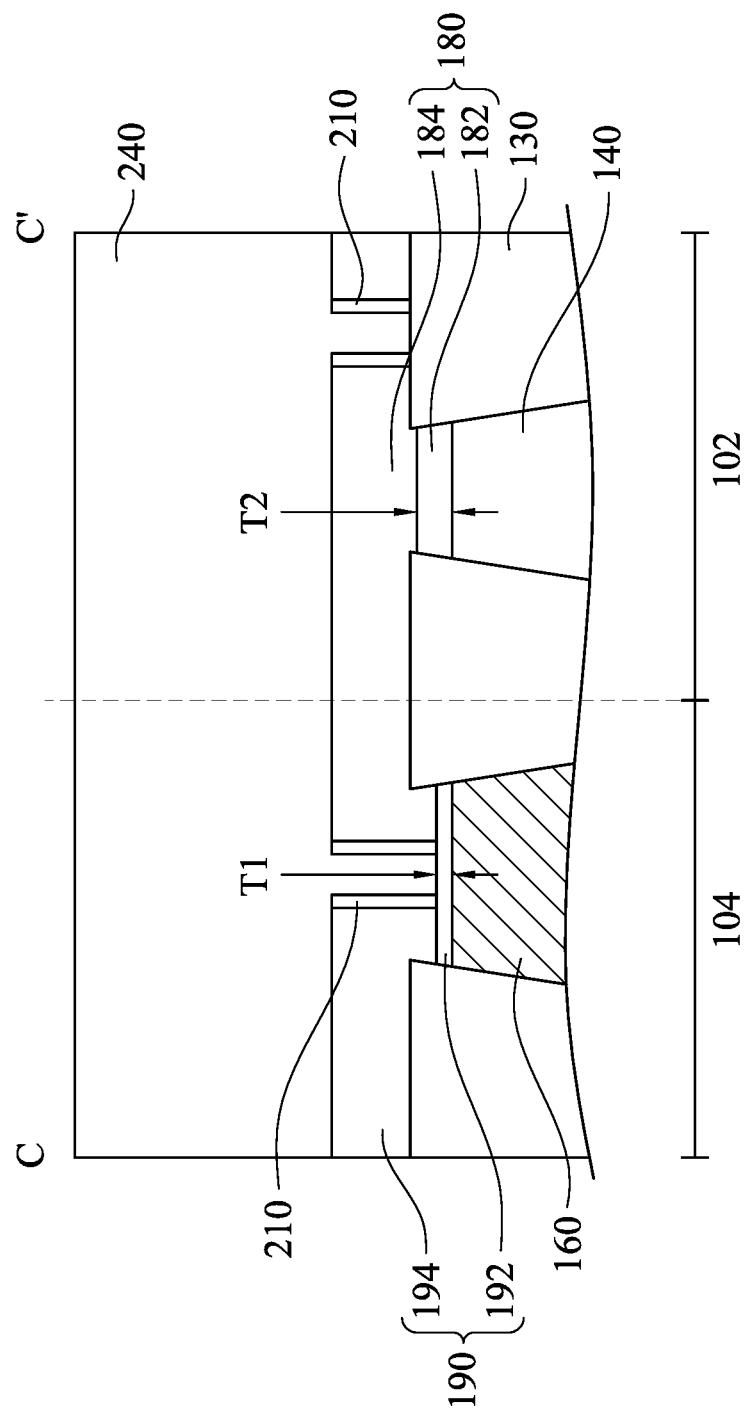
FIG. 11 is a cross-sectional view taking along line C-C' of FIG. 10.

FIG. 11 is a cross-sectional view taking along line C-C' of FIG. 10. Reference is made to FIG. 9 to FIG. 11. The capacitor Ca includes the top electrode 194 and the bottom electrode 160 spaced apart from the top electrode 194. The insulating layer 192 between the top electrode 194 and the bottom electrode 160 serves as an insulating layer of the capacitor Ca. In other words, the top electrode 194 of the conductive structure 190 is a top electrode of the capacitor Ca and the memory cap 160 is a bottom electrode of the capacitor Ca. The top electrode 194 is over the substrate 100, and the top electrode 194 is connected to the floating gate 184 of the second transistor Tb. In some embodiments, the capacitor Ca includes the light doped regions 200 and the doped regions 224 in the bottom electrode 160. The light doped regions 200 and the doped regions 224 of the capacitor Ca are uncovered by the top electrode 194 of the capacitor Ca. In some embodiments, a conductivity type of the bottom electrode 160 is the same as a conductivity type of the doped region 224. For example, the bottom electrode 160 and the doped region 224 have N-type dopants. In some embodiments, a (N-type) dopant concentration of the doped region 224 is greater than a dopant concentration of the bottom electrode 160.

In some embodiments, the bottom electrode 160 is in contact with a bottom of each of the doped regions 224 and a bottom of each of the light doped regions 200, the isolation structures 130, and the insulating layer 192. In some embodiments, each of the doped regions 224 is spaced apart from the insulating layer 192.

In some embodiments, the first transistor Ta includes the first gate dielectric layer 172 between the select gate 174 and the substrate 100, and the second transistor Tb includes the second gate dielectric layer 182 between the floating gate 184 and the substrate 100. The insulating layer 192 is between the top electrode 194 and the bottom electrode 160 of the substrate 100. In some embodiments, the nitrogen concentration of the insulating layer 192 of the capacitor Ca is higher than the nitrogen concentration of the gate dielectric layer 182 of the second transistor Tb. For example, the gate dielectric layer 182 of the second transistor Tb is substantially free of nitrogen and thus the nitrogen concentration of the gate dielectric layer 182 of the second transistor Tb is substantially zero. Similarly, the nitrogen concentration of the insulating layer 192 of the capacitor Ca is higher than the nitrogen concentration of the gate dielectric layer 172 of the first transistor Ta. For example, the gate dielectric layer 172 of the first transistor Ta is substantially free of nitrogen and thus the nitrogen concentration of the gate dielectric layer 172 of the first transistor Ta is substantially zero. In some embodiments, the thickness T1 of the insulating layer 192 of the capacitor Ca is smaller than the thickness T2 of the second gate dielectric layer 182 of the second gate structure 180 due to the diffusion of nitrogen dopants in the memory cap 160 (see FIGS. 3-4). Since the thickness T1 is reduced (e.g., in a range of about 80 angstroms to about 100 angstroms), a capacitance of the capacitor Ca can be increased by around 55% to 60% or a layout area of the capacitor Ca can be reduced by around 55% to 60% while the capacitance of the capacitor Ca reaches its desired value or range. In some embodiments, the insulating layer 192 of the conductive structure 190 is direct above and in contact with the memory cap 160, and the second gate dielectric layer 182 of the second gate structure 180 is direct above and in contact with the well region 140.

In some embodiments, the capacitor Ca has a capacitance $C_C$ and the second transistor Tb has a capacitance $C_F$. The coupling ratio $\alpha_{CF}$ can be obtained by following equation: $\alpha_{CF}=C_C/(C_C+C_F)$. In some embodiments, program and erase speed can be increased by using the ion implantation process I2 (see FIG. 3) and the coupling ratio can be increased with low program/erase voltage and small capacitor area. In some embodiments, the layout area of the capacitor Ca can be reduced by using the ion implantation process I2 (see FIG. 3) to reach the desired coupling ratio.

The first transistor Ta is electrically connected to the second transistor Tb in series. In greater detail, the first transistor Ta further includes source/drain regions 221 and 222 on opposite sides of the select gate 174, and the second transistor Tb further includes source/drain regions 222 and 223 on opposite sides of the floating gate 184. The first transistor Ta and the second transistor Tb share the source/drain region 222. The doped regions 220 include the source/drain regions 221-223 and doped region 224. The doped region 224 is in the memory cap 160.

Figure 12:
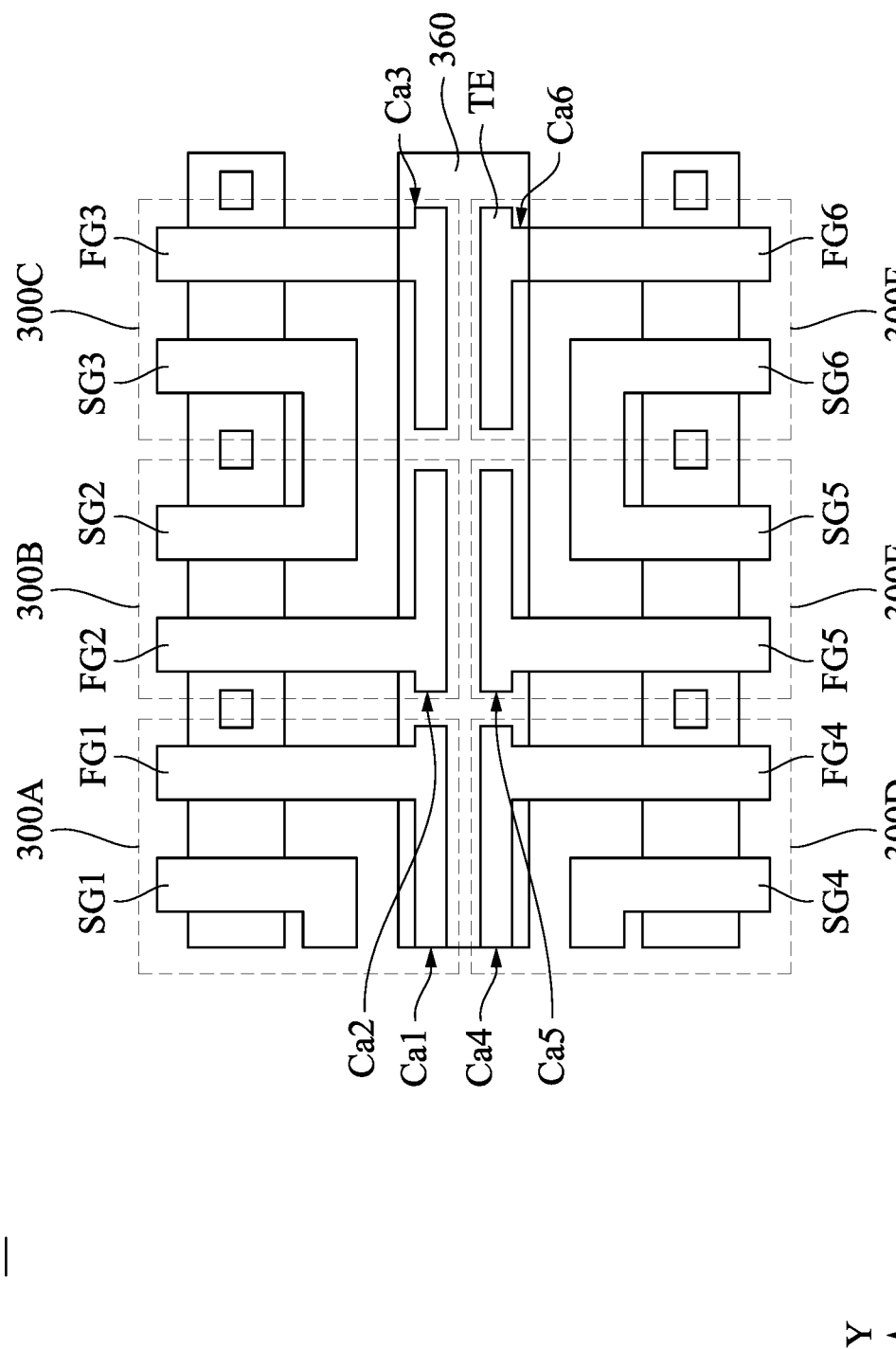
FIG. 12 is a top view of a memory device in accordance with some embodiments of the present disclosure.

The well region 140 includes first dopants having the first conductivity type (e.g., P-type in this case). The memory cap 160 is in the well region 140 and between the isolation structures 130 of the second memory region 104, in which the memory cap 160 includes second dopants having the second conductivity type (e.g., N-type in this case) different from the first conductivity type. In some embodiments, a portion 142 of the well region 140 is direct below the memory cap 160. The bottom surface 161 of the memory cap 160 is higher than the bottom surface 131 of each of the isolation structures 130. In some embodiments, the substrate 100 includes the doped region 150 between the isolation structures 130 of the peripheral region 106 of the substrate 100. The doped region 150 is spaced apart from the memory cap 160. The bottom surface 151 of the doped region 150 is higher than the bottom surface 161 of the memory cap 160. The bottom surface 161 of the memory cap 160 is between the bottom surface 151 of the doped region 150 and the bottom surface 131 of each of the isolation structures 130. FIG. 12 is a top view of a memory device 30 in accordance with some embodiments of the present disclosure. The memory device 30 includes six memory cells 300A, 300B, 300C, 300D, 300E, and 300F. Each of the memory cells 300A-300F has an identical structure as the memory device 10 of FIG. 10 but different orientations. As shown in FIG. 12, one of the memory cells 300A-300F on an upper side is symmetric to the other one of the memory cells 300A-300F on a lower side. That is, the memory cells 300A and 300D are symmetric with relative to the illustrated X axis, the memory cells 300B and 300E are symmetric with relative to the illustrated X axis, and the memory cells 300C and 300F are symmetric with relative to the illustrated X axis. Further, the memory cells 300A and 300B are symmetric with relative to the illustrated Y axis, the memory cells 300B and 300C are symmetric with relative to the illustrated Y axis, the memory cells 300D and 300E are symmetric with relative to the illustrated Y axis, and the memory cells 300E and 300F are symmetric with relative to the illustrated Y axis. The memory cells 300A, 300B, 300D, and 300E as a group may be reproduced and allocated as a plurality of rows and columns to form a memory cell array. Further, the memory cells 300A includes a select gate SG1, a floating gate FG1, and a capacitor Ca1, the memory cells 300B includes a select gate SG2, a floating gate FG2, and a capacitor Ca1, the memory cells 300C includes a select gate SG3, a floating gate SG3, and a capacitor Ca3, the memory cells 300D includes a select gate SG4, a floating gate SG4, and a capacitor Ca4, the memory cells 300E includes a select gate SG5, a floating gate SG5, and a capacitor Ca5, and the memory cells 300F includes a select gate SG6, a floating gate SG6, and a capacitor Ca6. The select gates of adjacent memory cells may be merged. For example, the select gate SG2 of the memory cell 300B and the select gate SG3 of the memory cell 300C are connected to each other, and the select gate SG5 of the memory cell 300E and the select gate SG6 of the memory cell 300F are connected to each other. The capacitors Ca1-Ca6 respectively have a top electrode and the capacitors Ca1-Ca6 share a same bottom electrode (i.e., the memory cap 360). For example, the capacitor Ca6 includes a top electrode TE and a bottom electrode 360. In some embodiments, each of the select gates SG1-SG6 is corresponds to the first gate structure 170 in FIGS. 9-11, and materials, configurations, dimensions, processes and/or operations regarding the select gates SG1-SG6 are similar to or the same as the first gate structure 170 in FIGS. 9-11, and, therefore, a description in this regard will not be repeated hereinafter. In some embodiments, each of the floating gates FG1-FG6 is corresponds to the second gate structure 180 in FIGS. 9-11, and materials, configurations, dimensions, processes and/or operations regarding the floating gates FG1-FG6 are similar to or the same as the second gate structure 180 in FIGS. 9-11, and, therefore, a description in this regard will not be repeated hereinafter. In some embodiments, each of the capacitors Ca1-Ca6 is correspond to the capacitor Ca in FIGS. 9-11, and, materials, configurations, dimensions, processes and/or operations regarding the capacitors Ca1-Ca6 are similar to or the same as the capacitor Ca in FIGS. 9-11, and, therefore, a description in this regard will not be repeated hereinafter.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that due to the nitrogen implantation of the memory cap, thinner insulating layer of the capacitor over the memory cap can be achieved. Further, high gate coupling ratio with small area of the capacitor of the memory device can be achieved.

According to some embodiments, a memory device includes a substrate, a first transistor, a second transistor, and a capacitor. The first transistor is over the substrate and includes a select gate. The second transistor is over the substrate and connected to the first transistor in series, in which the second transistor includes a floating gate. The capacitor is over the substrate and connected to the second transistor, wherein the capacitor includes a top electrode, a bottom electrode in the substrate, and an insulating layer between the top electrode and the bottom electrode, the insulating layer includes nitrogen, and a nitrogen concentration of the insulating layer increases in a direction from the top electrode to the bottom electrode.

According to some embodiments, a memory device includes a substrate, a first transistor, a second transistor, and a capacitor. The first transistor includes a select gate, a first gate dielectric layer between the select gate and the substrate, and a first source/drain region in the substrate. The second transistor includes a floating gate and the first source/drain region. The capacitor includes a top electrode, a bottom electrode, and an insulating layer between the top electrode and the bottom electrode. The top electrode of the capacitor is connected to the floating gate of the second transistor, and the insulating layer of the capacitor is thinner than the first gate dielectric layer of the first transistor.

According to some embodiments, a method of forming a memory device includes forming an isolation structure in a substrate to define a transistor region and a capacitor region in the substrate. A well region is formed in the substrate, in which the well region includes first dopants having a first conductivity type. A memory cap is formed in the well region and in the capacitor region of the substrate, in which the memory cap includes second dopants having a second conductivity type different from the first conductivity type. An ion implantation process is performed to implant nitrogen in the memory cap. After implanting nitrogen in the memory cap, forming a dielectric layer over the substrate and in contact with the well region and the memory cap of the substrate. A conductive layer is deposited over the dielectric layer. The conductive layer is patterned to form a select gate and a floating gate over the transistor region of the substrate and a top electrode over the capacitor region of the substrate. The dielectric layer is patterned to form a first gate dielectric layer between the select gate and the substrate, a second gate dielectric layer between the floating gate and the substrate, and an insulating layer between the top electrode and the memory cap of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a substrate;
a first transistor over the substrate and comprising a select gate;
a second transistor over the substrate and connected to the first transistor in series, wherein the second transistor comprises a floating gate and a gate dielectric layer over the substrate; and
a capacitor over the substrate and connected to the second transistor, wherein the capacitor comprises a top electrode, a bottom electrode in the substrate, and an insulating layer between the top electrode and the bottom electrode, the insulating layer comprises nitrogen, a nitrogen concentration of the insulating layer increases in a direction from the top electrode to the bottom electrode, and the nitrogen concentration of the insulating layer of the capacitor is higher than a nitrogen concentration of the gate dielectric layer of the second transistor.

2. The memory device of claim 1, wherein the bottom electrode comprises phosphorous (P), arsenic (As), antimony (Sb), or combinations thereof.

3. The memory device of claim 1, wherein the bottom electrode is substantially free of nitrogen.

4. The memory device of claim 1, wherein the top electrode of the capacitor is connected to the floating gate of the second transistor.

5. The memory device of claim 1, wherein the capacitor further comprises a doped region in the bottom electrode, wherein a dopant concentration of the doped region is greater than a dopant concentration of the bottom electrode.

6. The memory device of claim 5, wherein the doped region of the capacitor is uncovered by the top electrode of the capacitor.

7. The memory device of claim 1, wherein the top electrode of the capacitor has a T-shape in a top view.

8. A memory device, comprising:
a substrate;
a first transistor comprising a select gate, a first gate dielectric layer between the select gate and the substrate, and a first source/drain region in the substrate;
a second transistor comprising a floating gate and the first source/drain region; and
a capacitor comprising a top electrode, a bottom electrode, and an insulating layer between the top electrode and the bottom electrode, wherein the top electrode of the capacitor is connected to the floating gate of the second transistor, the insulating layer of the capacitor is thinner than the first gate dielectric layer of the first transistor, and a nitrogen concentration of the insulating layer is higher than a nitrogen concentration of the first gate dielectric layer.

9. The memory device of claim 8, wherein the second transistor further comprises a second gate dielectric layer between the floating gate and the substrate, wherein the insulating layer of the capacitor is thinner than the second gate dielectric layer of the second transistor.

10. The memory device of claim 8, wherein a thickness of the insulating layer of the capacitor is in a range of about 80 angstroms to about 100 angstroms.

11. The memory device of claim 8, further comprising:
a doped region in the bottom electrode, wherein a conductivity type of the bottom electrode is the same as a conductivity type of the doped region, and a dopant concentration of the doped region is greater than a dopant concentration of the bottom electrode.

12. The memory device of claim 11, wherein the bottom electrode is in contact with a bottom of the doped region and the insulating layer, and the doped region is spaced apart from the insulating layer.

13. The memory device of claim 11, further comprising:
a word line connected to the doped region.

14. The memory device of claim 11, wherein the first transistor further comprises a second source/drain region connected to a source line.

15. A memory device, comprising:
a buried layer;
a well region over the buried layer;
an isolation structure embedded in the well region;
a capacitor over the buried layer and comprising:
a bottom electrode in the well region and in contact with the isolation structure;
a top electrode over the bottom electrode; and an insulating layer between the bottom electrode and the top electrode;
a transistor over the buried layer and comprising:
  a floating gate over the well region;
  source/drain regions in the well region and on opposite sides of the floating gate; and
  a gate dielectric layer under the floating gate; and
a connecting line physically connecting the top electrode of the capacitor and the floating gate of the transistor and in contact with the isolation structure, wherein a bottom surface of the floating gate is higher than a bottom surface of the top electrode, a nitrogen concentration of the insulating layer is higher than a nitrogen concentration of the gate dielectric layer, and a thickness of the insulating layer is smaller than a thickness of the gate dielectric layer.

16. The memory device of claim 15, wherein a bottom surface of the connecting line is higher than the bottom surface of the top electrode of the capacitor.

17. The memory device of claim 15, wherein the connecting line, the floating gate, and the top electrode comprise the same materials.

18. The memory device of claim 15, wherein a thickness of the insulating layer is in a range of about 80 angstroms to about 100 angstroms.

19. The memory device of claim 15, wherein a thickness of the gate dielectric layer is in a range of about 115 angstroms to about 135 angstroms.

20. The memory device of claim 15, wherein a bottom surface of the bottom electrode of the capacitor is higher than a bottom surface of the isolation structure.

* * * * *